(12) United States Patent
Jiang et al.

(10) Patent No.: US 11,431,301 B2
(45) Date of Patent: Aug. 30, 2022

(54) WIDEBAND AMPLIFIER TUNING

(71) Applicant: pSemi Corporation, San Diego, CA (US)

(72) Inventors: Rong Jiang, San Diego, CA (US); Khushali Shah, San Diego, CA (US)

(73) Assignee: pSemi Corporation, San Diego, CA (US)

(*) Notice: Subject to any disclaimer, the term of this patent is extended or adjusted under 35 U.S.C. 154(b) by 75 days.

(21) Appl. No.: 17/017,456

(22) Filed: Sep. 10, 2020

(65) Prior Publication Data

US 2022/0077827 A1 Mar. 10, 2022

(51) Int. Cl.
*H03F 1/07* (2006.01)
*H03F 1/56* (2006.01)
*H03F 3/195* (2006.01)

(52) U.S. Cl.
CPC ............ *H03F 1/565* (2013.01); *H03F 3/195* (2013.01); *H03F 2200/294* (2013.01); *H03F 2200/451* (2013.01)

(58) Field of Classification Search
CPC .................................... H03F 1/02; H03F 1/07
USPC ........................................ 330/124 R, 295, 51
See application file for complete search history.

(56) References Cited

U.S. PATENT DOCUMENTS

| | | | | |
|---|---|---|---|---|
| 7,821,334 B2* | 10/2010 | Maeda | ............... | H03F 1/42 330/51 |
| 8,710,927 B2* | 4/2014 | Kamitani | ............... | H03F 3/72 330/295 |
| 9,197,194 B2 | 11/2015 | Reedy et al. | | |
| 9,929,701 B1 | 3/2018 | Noori et al. | | |
| 10,326,484 B1* | 6/2019 | Ayranci | ............... | H04B 1/006 |
| 2010/0188146 A1* | 7/2010 | Chung | ............... | H03F 3/211 330/124 R |
| 2011/0037516 A1* | 2/2011 | Nejati | ............... | H03F 3/211 330/124 R |
| 2015/0109055 A1 | 4/2015 | Botti | | |
| 2016/0056774 A1 | 2/2016 | Ilkov et al. | | |
| 2019/0363690 A1 | 11/2019 | Golat et al. | | |
| 2020/0036353 A1 | 1/2020 | Zhang | | |

OTHER PUBLICATIONS

Park, Hye Lyun, International Search Report and Written Opinion received from the KIPO dated Dec. 30, 21 for appln No. PCT/US2021/049698, 9 pgs.

* cited by examiner

*Primary Examiner* — Henry Choe
(74) *Attorney, Agent, or Firm* — Jaquez Land Greenhaus & McFarland LLP; John Land, Esq.

(57) ABSTRACT

Circuit and methods using a single low-noise amplifier (LNA) to provide amplification for a wide band of RF frequencies while maintaining high gain and a low noise factor. Embodiments include an amplifier circuit including an input signal path for receiving a wideband RF signal; a switched inductor tuning block coupled to the input signal path and configured to selectively couple one of a plurality of inductances to the input signal path; and an amplifier coupled to the switched inductor tuning block and configured to receive the RF signal after passage through the selected coupled inductance. The switched inductor tuning block includes a plurality of selectable branches, each including an RF input switch; an RF output switch; an inductor coupled between the RF input switch and the RF output switch; and first and second shunt switches coupled between a respective terminal of the inductor and circuit ground.

23 Claims, 9 Drawing Sheets

WIDEBAND AMPLIFIER TUNING

BACKGROUND

(1) Technical Field

This invention relates to electronic circuitry, and more particularly to radio frequency low noise amplifiers.

(2) Background

Many modern electronic systems include radio frequency (RF) receivers; examples include personal computers, tablet computers, wireless network components, televisions, cable system "set top" boxes, radar systems, and cellular telephones. Many RF receivers are paired with RF transmitters in transceivers, which often are quite complex two-way radios. In some cases, RF transceivers are capable of transmitting and receiving across multiple frequencies in multiple bands; for instance, in the United States, the 2.4 GHz band is divided into 14 frequency ranges (channels) spaced about 5 MHz apart. As another example, a modern "smart telephone" may include RF transceiver circuitry capable of concurrently operating on different cellular communications systems (e.g., GSM, CDMA, and LTE), on different wireless network frequencies and protocols (e.g., IEEE 802.11abgn at 2.4 GHz and 5 GHz), and on "personal" area networks (e.g., Bluetooth based systems).

The receiver-side of an RF transceiver includes a "front end" that generally includes at least one low noise amplifier ("LNA"). An LNA is responsible for providing the first stage of amplification for a received RF signal. In many applications, multiple LNAs are needed to cover all frequencies in one or more bands. For example, FIG. 1 is block diagram of a simplified RF receiver 100 having multiple LNAs. An RF signal source 102, such as one or more antennas, provides an RF signal to n LNAs (LNA1-LNAn), each of which provides an amplified RF signal to "downstream" circuits such as down-conversion and baseband circuitry 104_1, 104_n. In the illustrated example, LNA1-LNAn may be individually enabled or disabled by a corresponding control signal, ENABLE1-ENABLEn. Additional components not shown in FIG. 1 may include, for example (1) RF switches, filters, and impedance matching circuitry before LNA1-LNAn, and (2) attenuators, filters, and impedance matching circuitry after LNA1-LNAn.

The operational characteristics of an LNA are very important to the overall quality of an RF receiver, particularly low noise, gain flatness (i.e., signal gain variation across frequency), linearity, input matching, and output matching. However, it is known that low noise, gain flatness, linearity, input matching, and output matching are hard to achieve over a wide band. Accordingly, multiple narrow-band, single-stage LNAs are generally used to cover all frequency bands required of an RF transceiver. Typically, each LNA requires dedicated analog circuitry, such as inductors, capacitors, bias voltage generators, signal level shifters, matching networks, etc.

Modern RF receivers, whether stand-alone or as part of a transceiver, are generally embodied in an integrated circuit (IC) die. As in many areas of modern electronics, a smaller die size is a key goal for cost reduction of RF products. However, RF receivers that include multiple narrow-band, single-stage LNAs consume a significant die area for all of the necessary dedicated analog circuitry.

Accordingly, there is a need for compact LNA circuitry that overcomes the limitations of the prior art, particularly with respect to accommodating a wide band of frequencies in a compact circuit design. Embodiments of the present invention provide such circuitry, as well as additional benefits.

SUMMARY

The invention encompasses circuit and methods using a single low-noise amplifier (LNA) to provide amplification for a wide band of RF frequencies while maintaining high gain and a low noise factor (NF).

Embodiments include an amplifier circuit including an input signal path for receiving a wideband radio frequency (RF) signal; a switched inductor tuning block coupled to the input signal path and configured to selectively couple one of a plurality of inductances in series with the input signal path; and an amplifier having an input coupled to the switched inductor tuning block and configured to receive the RF signal after passage through the selected coupled inductance, and an output for providing an amplified version of the RF signal. The switched inductor tuning block includes a plurality of selectable branches, each branch including: an RF signal input switch; an RF signal output switch; an inductor coupled between the RF signal input switch and the RF signal output switch; a first shunt switch coupled between a first terminal of the inductor and circuit ground; and a second shunt switch coupled between a second terminal of the inductor and circuit ground.

The details of one or more embodiments of the invention are set forth in the accompanying drawings and the description below. Other features, objects, and advantages of the invention will be apparent from the description and drawings, and from the claims.

DETAILED DESCRIPTION

The invention encompasses circuit and methods using a single low-noise amplifier (LNA) to provide amplification for a wide band of RF frequencies while maintaining high gain and a low noise factor (NF).

Figure 1:
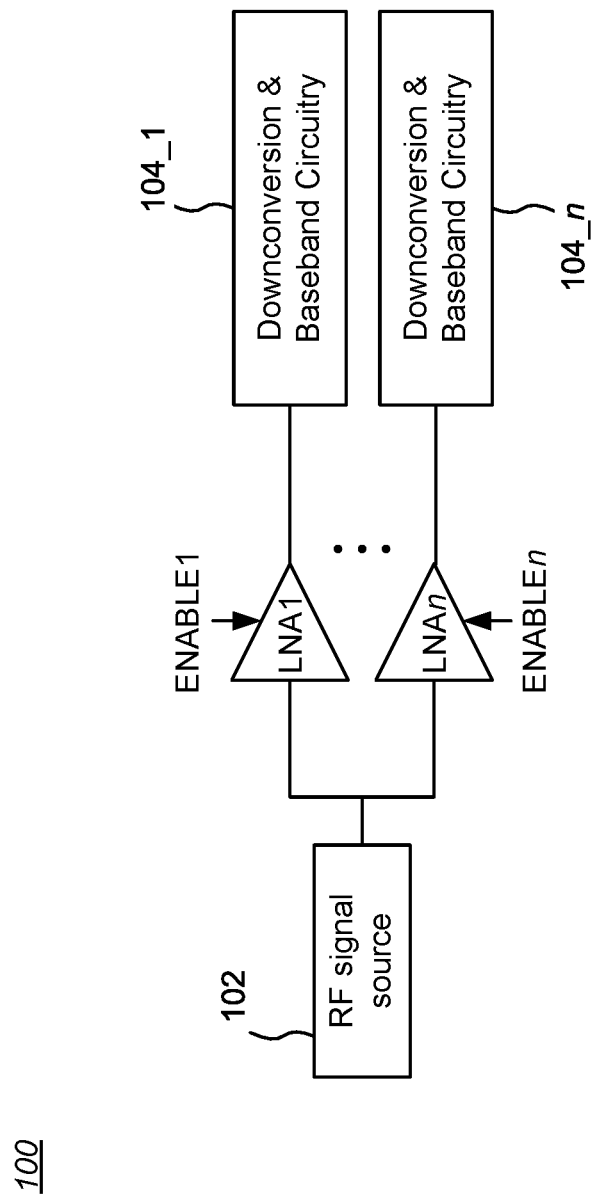
FIG. 1 is block diagram of a simplified RF receiver having multiple LNAs.
Figure 2:
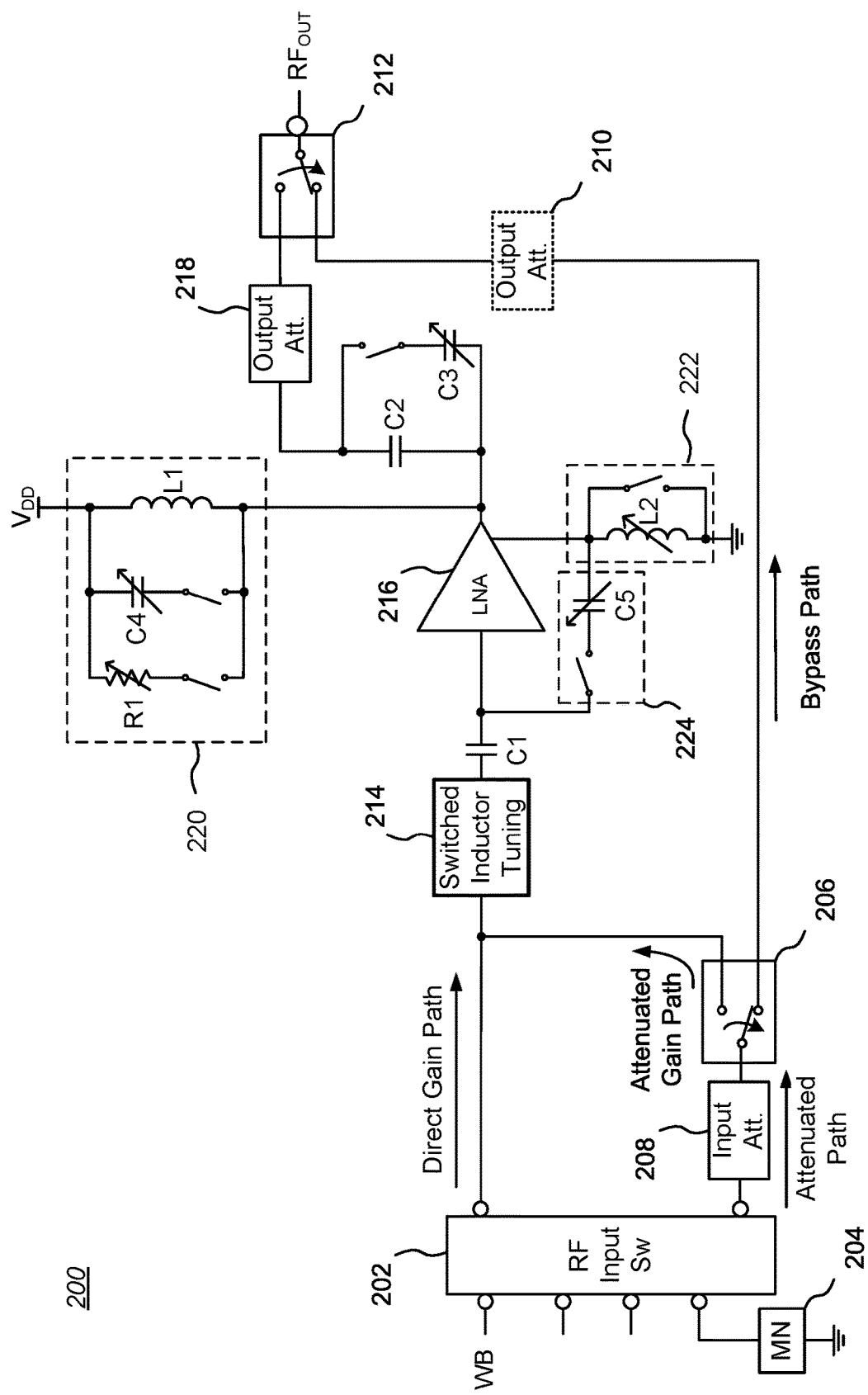
FIG. 2 is a block diagram of one embodiment of a wide-band single-LNA amplifier circuit in accordance with the present invention.

FIG. 2 is a block diagram of one embodiment of a wide-band single-LNA amplifier circuit 200 in accordance with the present invention. Radio frequency (RF) input signals, such as from one or more antennas, may be applied to one or more input ports of an RF input switch 202. The RF input switch 202 selectively couples one or more of the RF input signals to a Direct Gain Path and/or to an Attenuated Path. In some embodiments, a matching network 204 may be coupled to one input port of the RF input switch 202, and such that the RF input switch 202 can selectively couple the matching network 204 to the Direct Gain Path and/or the Attenuated Path in combination with selection of an RF input signal to the same path, thus putting the matching network 204 in-circuit with the selected path, thereby acting upon the selected RF input signal.

The Attenuated Path is shown coupled to a path switch 206 through an input attenuator 208. The input attenuator 208 typically allows selection of a one or more levels of attenuation (useful if a strong RF input signal is present), and in some embodiments may allow for internal bypassing of any attenuation. The path switch 206 allows the selected RF signal from the input attenuator 208 to be switched to a Bypass Path or to an Attenuated Gain Path.

Selected RF signals switched to the Bypass Path by the path switch 206 may be applied to an optional output attenuator 210, which typically allows selection of a one or more levels of attenuation and in some embodiments may allow for internal bypassing of any attenuation. The Bypass Path is coupled to an output switch 212, the output of which is an $RF_{OUT}$ signal.

Selected RF signals switched to the Attenuated Gain Path by the path switch 206 are coupled to the input of a switched inductor tuning block 214. RF signals switch to the Direct Gain Path by the RF input switch 202 are also coupled to the input of a switched inductor tuning block 214, described below in greater detail. The output of the switched inductor tuning block 214 is coupled through a DC blocking capacitor C1 to the input of a signal LNA 216. The LNA 216 may be of different designs as needed for particular applications. Examples of low-noise amplifiers that may be used for the LNA 216 are described in U.S. Pat. No. 9,929,701, issued Mar. 27, 2018, entitled "*LNA with Programmable Linearity*", assigned the assignee of the present invention and incorporated herein by reference.

The output of the LNA 216 is coupled to a DC blocking and output impedance matching capacitor C2, which may have a bypassable variable capacitor C3 coupled in parallel to provide for output impedance tuning. The capacitors C2 and C3 are coupled to an output attenuator 218. The output attenuator 218 typically allows selection of a one or more levels of attenuation and in some embodiments may allow for internal bypassing of any attenuation. The output of the output attenuator 218 is coupled to the output switch 212. Accordingly, the output switch 212 may selectively output either an amplified RF signal from the LNA 216, or a selected RF signal from the Bypass Path. In the illustrated example, the Attenuated Gain Path and the Bypass Path are selected by the path switch 206 and the output switch 212 for RF signal propagation.

A tunable load matching circuit 220 coupled to the output of the LNA 216 allows the output impedance of the amplifier circuit 200 to be matched to a load coupled to the $RF_{OUT}$ port of the output switch 212. In the illustrated example, the tunable load matching circuit 220 includes an inductor L1 (shown as fixed, but may be adjustable) coupled to a power supply $V_{DD}$, a tunable and selectable shunt capacitance C4, and a tunable and selectable resistance R1. As is known in the art, alternative circuits may be used for the tunable load matching circuit 220 as needed for specific applications.

The LNA 216 may be coupled (e.g., to a ground terminal of the LNA 216) to a bypassable and adjustable source degeneration inductor circuit 222, which in turn is coupled to circuit ground. The bypassable and adjustable source degeneration inductor circuit 222 includes an adjustable inductor L2 that allows various levels (including zero, if bypassed) of inductance to be coupled to the internal circuitry of the LNA 216 to adjust input matching as may be needed for specific applications, achieve gain tuning, and, in most cases, provide good linearity.

Similarly, the LNA 216 may be coupled (e.g., to a ground terminal of the LNA 216) to a tunable and selectable capacitance circuit 224, which in turn is coupled to the input of LNA 216. The tunable and selectable capacitance circuit 224 includes an adjustable capacitor C5 that allows various levels (including zero) of capacitance to be coupled to the input and internal circuitry of the LNA 216 to adjust input matching for the LNA 216 as may be needed for specific applications.

All switching of the illustrated switches may be by an amplifier controller (not shown), which sets the state of the switches (as well as bias levels within the LNA 216) based on, for example, information regarding the types of RF signals that will be received by the amplifier circuit 200, the content carried by the RF signals, and/or based on user commands to select one or more RF bands or channels. The amplifier controller may be a general-purpose processor capable of receiving commands and processing the commands to generate control signals to the LNA 216 and illustrated associated switches shown in FIG. 2. Alternatively, the amplifier controller may be a dedicated processor specially designed for generating such control signals. In some cases, the amplifier controller may be as simple as a logic block with look-up table.

Example Switched Inductor Tuning Block

While some of the RF input signals applied to the RF input switch 202 may be constrained to a relatively narrow band by design, to accommodate integrated circuit (IC) customers with widely varying specifications, it is useful to design one or more ports of the RF input switch 202 to be able to accommodate a wide frequency range (e.g., about 1.4 GHz to about 2.7 GHz, a 1300 MHz total bandwidth) without needing multiple LNAs. Avoiding multiple LNAs results in a smaller, more economical IC chip. However, it is important to maintain good gain (e.g., at least about 17-19 dB, and at least about 20 dB in some applications) and a low noise factor (e.g., less than about 1.7 dB, and less than about 1.2 dB in some applications) over such a wideband signal. Such specifications have not been found to be achievable using a single LNA with most conventional design techniques while minimizing IC chip size. For example, in modeled circuits, optimizing a conventional single-LNA amplifier for good gain and NF performance at one end of the wideband (e.g., either the 2.7 GHz end or the 1.4 GHz end of the example frequency range mentioned above) and adjusting conventional tuning components for tuning at the other end of the wideband (e.g., either the 1.4 GHz end or the 2.7 GHz end of the example frequency range mentioned above) results in unacceptable performance degradation, especially for gain (less than about 18 dB at one end).

Accordingly, allowing a wideband port WB for the RF input switch 202 requires careful consideration of the overall architecture of the amplifier circuit 200. The solution provided by the present invention is the switched inductor tuning block 214 before the input to the LNA 216 of FIG. 2. The switched inductor tuning block 214 allows for the introduction of two or more tuning (impedance matching) inductors that can be optimized for sub-bands of a wideband RF input signal with little degradation of gain or increase in noise figure.

Figure 3:
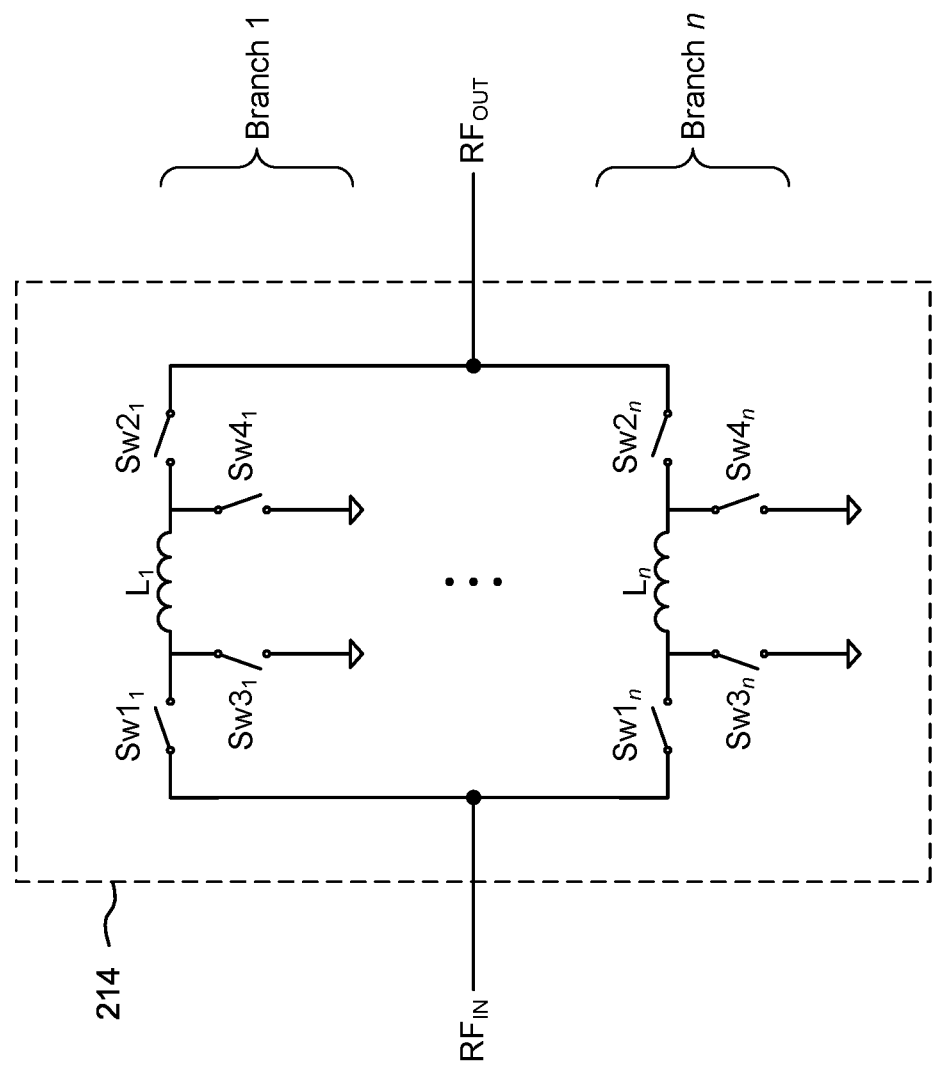
FIG. 3 is a schematic diagram of one embodiment of a switched inductor tuning block suitable for use in the amplifier circuit of FIG. 2.

FIG. 3 is a schematic diagram 300 of one embodiment of a switched inductor tuning block 214 suitable for use in the amplifier circuit 200 of FIG. 2. The switched inductor tuning block 214 includes circuit branches 1 to n, where n≥2. Each circuit branch X of the n circuit branches includes an inductor $L_X$ that is generally selected for good performance over a selected sub-band of a wideband RF input signal. For example, for a wideband from about 1.4 GHz to about 2.7 GHz, a first inductor $L_1$ may be selected for good performance from about 1.8 GHz to about 2.7 GHz, and a second inductor $L_2$ may be selected for good performance from about 1.4 GHz to about 1.7 GHz. The inductors $L_X$ may be internal to an IC chip embodiment, or may be a component external to an IC chip embodiment and coupled to the remaining circuitry of the switched inductor tuning block 214 via solder bumps, wire bonds, or the like, or may be a combination of internal and external inductors.

The inductor $L_X$ of each branch X is coupled between a series switch $Sw1_X$ on an $RF_{IN}$ input port side and a series switch $Sw2_X$ on an $RF_{OUT}$ output port side. Coupled between respective ends of the inductor $L_X$ and circuit ground are respective shunt switches $Sw3_X$ and $Sw4_X$. Having shunt switches $Sw3_X$ and $Sw4_X$ on both sides of the inductor $L_X$ provides good isolation, since the series switches $Sw1_X$, $Sw2_X$ may exhibit a capacitance, $C_{OFF}$, when opened that may adversely affect the performance of the LNA 216.

The operation of a selected branch X within the switched inductor tuning block 214 is straightforward. For example, if branch 1 is to be coupled in-circuit between the $RF_{IN}$ and $RF_{OUT}$ ports in a signal passage mode (i.e., branch 1 is selected), then switches $Sw1_1$ and $Sw2_1$ are closed (turned ON) and switches $Sw3_1$ and $Sw4_1$ are opened (turned OFF). Conversely, if branch 1 is to be taken out-of-circuit from between the $RF_{IN}$ and $RF_{OUT}$ ports in an isolation mode (i.e., branch 1 is deselected), then switches $Sw1_1$ and $Sw2_1$ are opened and switches $Sw3_1$ and $Sw4_1$ are closed.

Of note, more than one branch X may be in-circuit at a time. For example, in a two branch embodiment of the switched inductor tuning block 214, four connection possibilities exist: branches 1 and 2 are deselected; branch 1 is selected and branch 2 is deselected; branch 1 is deselected and branch 2 is selected; or branches 1 and 2 are both selected. Thus, three inductance states can be selected for a signal path from $RF_{IN}$ to $RF_{OUT}$ in a two-branch switched inductor tuning block 214: inductor $L_1$ alone, inductor $L_2$ alone, or inductors $L_1$ and $L_2$ in parallel. As should be clear, additional combinations of inductors $L_X$ can be created for a switched inductor tuning block 214 having more than two branches X.

Figure 4:
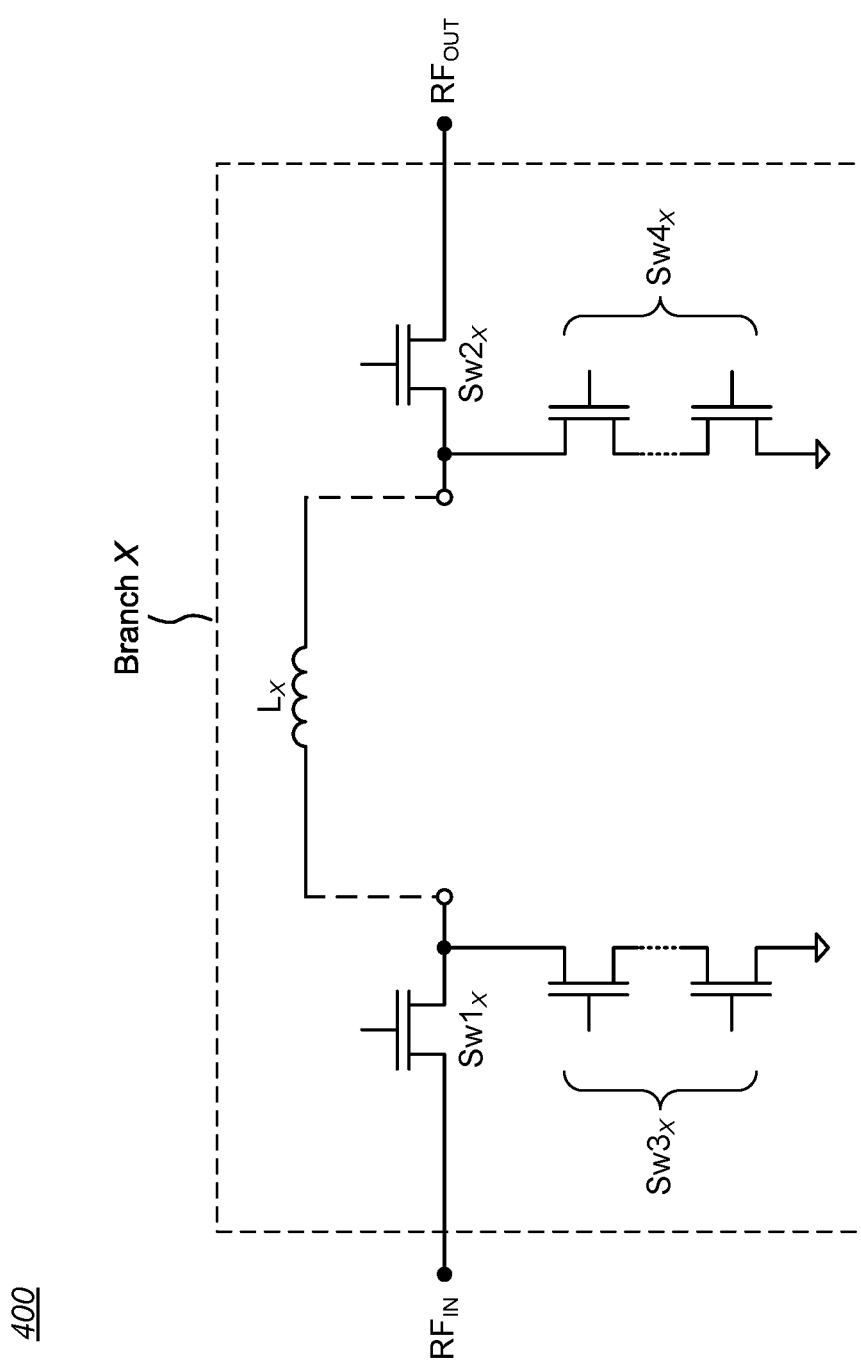
FIG. 4 is a circuit diagram of one embodiment of one branch X for the switched inductor tuning block of FIG. 3, using field effect transistors (FETs) for switches.

FIG. 4 is a circuit diagram 400 of one embodiment of one branch X for the switched inductor tuning block 214 of FIG. 3, using field effect transistors (FETs) for switches. In the illustrated example, each of the series switches $Sw1_X$, $Sw2_X$ are implemented as single FETs, such as MOSFETs. In some embodiments, the series switches $Sw1_X$, $Sw2_X$ may be implemented as two or more series coupled FETs. The shunt switches $Sw3_X$, $Sw4_X$ are shown implemented as one or more FETs coupled in series (also known as a "stack") between respective ends of the inductor $L_X$ and circuit ground. If more than one FET in series is used for the series switches $Sw1_X$, $Sw2_X$ or the shunt switches $Sw3_X$, $Sw4_X$, each FET in the series is controlled by the same control signal, and thus the series of FETs behaves like a single switch. In this example, the inductor $L_X$ is shown connected by dashed lines, indicating that the inductor $L_X$ is external to an IC embodiment of the switches $Sw1_X$, $Sw2_X$, $Sw3_X$, $Sw4_X$ (some or all of which may be integrated on the IC embodiment with the LNA 216 and some or all of the additional circuitry shown in FIG. 2 surrounding the LNA 216).

One benefit of stacking FETs for the shunt switches $Sw3_X$, $Sw4_X$ is that stacked FETs can withstand a higher voltage than a single FET when in the OFF state, which provides protection, for example, from electrostatic discharge (ESD) events. Stacking FETs also increases RF power handling and improves linearity.

One advantage of branch X embodiments like the example shown in FIG. 4 is that an applied $RF_{IN}$ signal passes through only one inductor, whereas if two or more inductors are used in series, at least one of which is bypassable, the OFF (bypassed) inductor(s) will have a lower Q factor than a single inductor and suffer higher module parasitics.

For practical reasons, it may be desirable to tradeoff the OFF state capacitance, CUFF, against the ON state resistance, $R_{ON}$, of each FET. Thus, for example, the switch $Sw2_X$ nearest the LNA 216 generally should have a low $C_{OFF}$ and a low $R_{ON}$, since the LNA 216 is sensitive to capacitance but the impedance of the signal path also should be kept low. On the other hand, the switch $Sw1_X$ furthest from the LNA 216 may favor a low $R_{ON}$ over a low $C_{OFF}$, to lower the impedance of the signal path on the ON state, while $C_{OFF}$ can be relatively higher. Accordingly, the FET comprising switch $Sw2_X$ generally should be smaller than the FET comprising switch $Sw1_X$; for example, $Sw2_X$ may have a total width about half the total width of $Sw1_X$. As another example, the FET or FETs implementing the shunt switches $Sw3_X$, $Sw4_X$ generally should have a low CUFF, again because the LNA 216 is sensitive to capacitance. As frequency increases, the FET comprising switch $Sw2_X$ can be made even smaller relative to the FET comprising switch $Sw1_X$; conversely, as frequency decreases, the FET comprising switch $Sw2_X$ will generally be larger relative to the FET comprising switch $Sw1_X$.

A modeled embodiment of the single-LNA amplifier circuit 200 of FIG. 2, using a MOSFET implementation of the switched inductor tuning block 214 in accordance with FIG. 4, exhibits a gain of about 20 dB over a 1300 MHz tuning range (from 1.4 GHz to about 2.7 GHz), with an NF of less than about 1.2 dB. Using only a single LNA keeps an IC die size smaller than a multiple-LNA solution, while requiring only two connections (e.g., solder bumps) per external tuning inductor $L_X$.

It should be noted that embodiments of the switched inductor tuning block 214 may be used with other types of broadband amplifiers, including power amplifiers. In addition, in some embodiments, the switched inductor tuning block 214 may be coupled to the output of an amplifier, for example, for impedance matching or power matching. More generally, a switched inductor tuning block 214 may be used anywhere in an amplifier circuit having a signal path that needs different inductor values for different modes of operation and which requires decent isolation and/or less correlation among those signal paths.

Figure 5A:
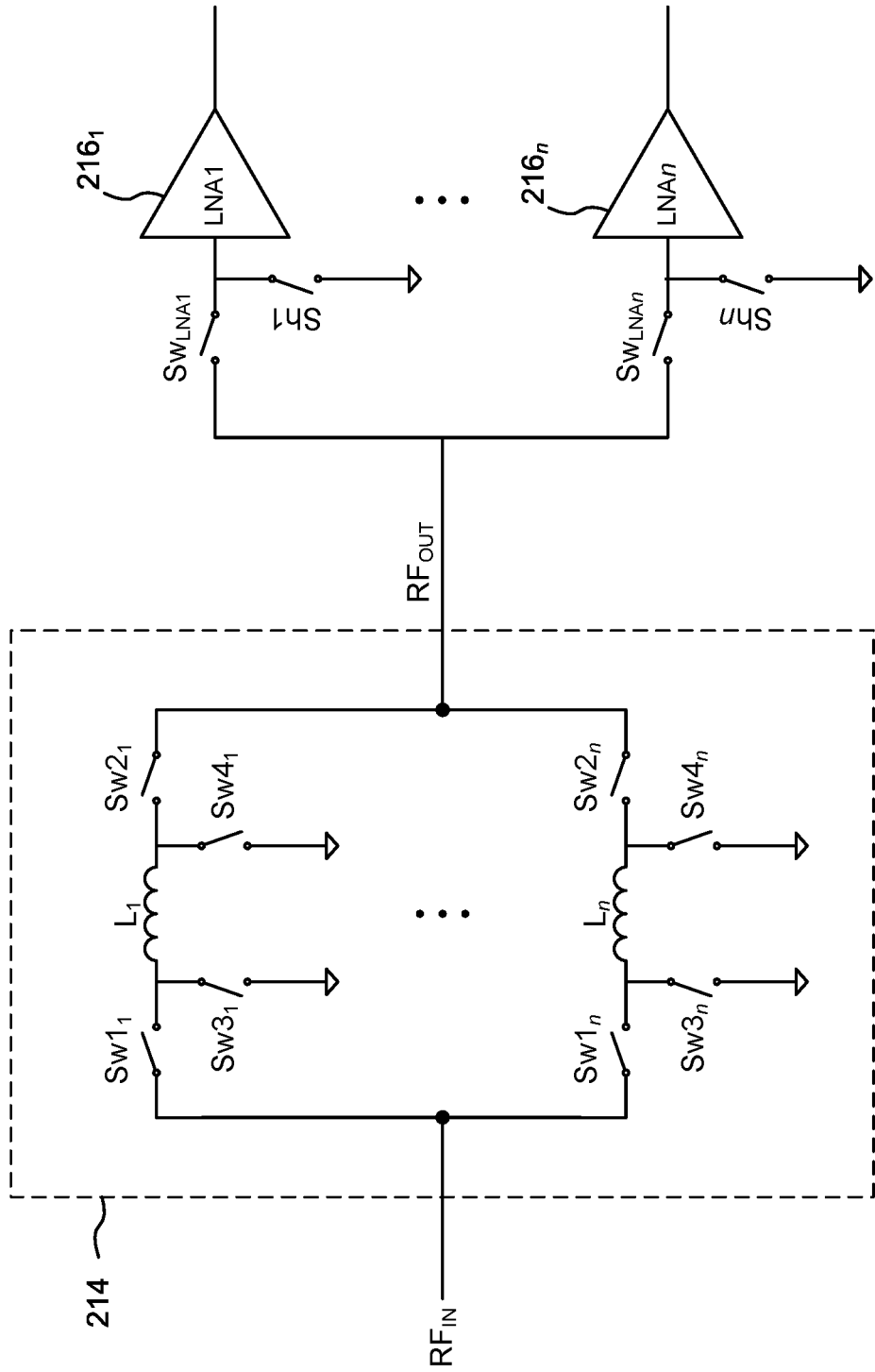
FIG. 5A is a block diagram showing a first configuration of multiple LNAs coupled to the $RF_{OUT}$ port of a switched inductor tuning block through series switches.

While FIG. 2 shows the switched inductor tuning block 214 coupled to a single LNA 216, embodiments may include multiple LNA's selectively couplable to the switched inductor tuning block 214. For example, FIG. 5A is a block diagram 500 showing a first configuration of multiple LNAs $216_1$-$216_n$ coupled to the $RF_{OUT}$ port of a switched inductor tuning block 214 through corresponding series switches $Sw_{LNA1}$-$Sw_{LNAn}$. In the illustrated example, a particular LNA $216_1$-$216_N$ may be coupled to any inductor L1-Ln by selecting an inductor signal path, as described above, and closing the series switch corresponding to the particular LNA while opening the series switches corresponding to the other LNAs. Optional shunt switches Sh1-Shn may be coupled to the respective inputs of the LNAs $216_1$-$216_n$ to provide even better isolation by opening the shunt switch corresponding to the particular LNA while closing the shunt switches corresponding to the other LNAs.

Figure 5B:
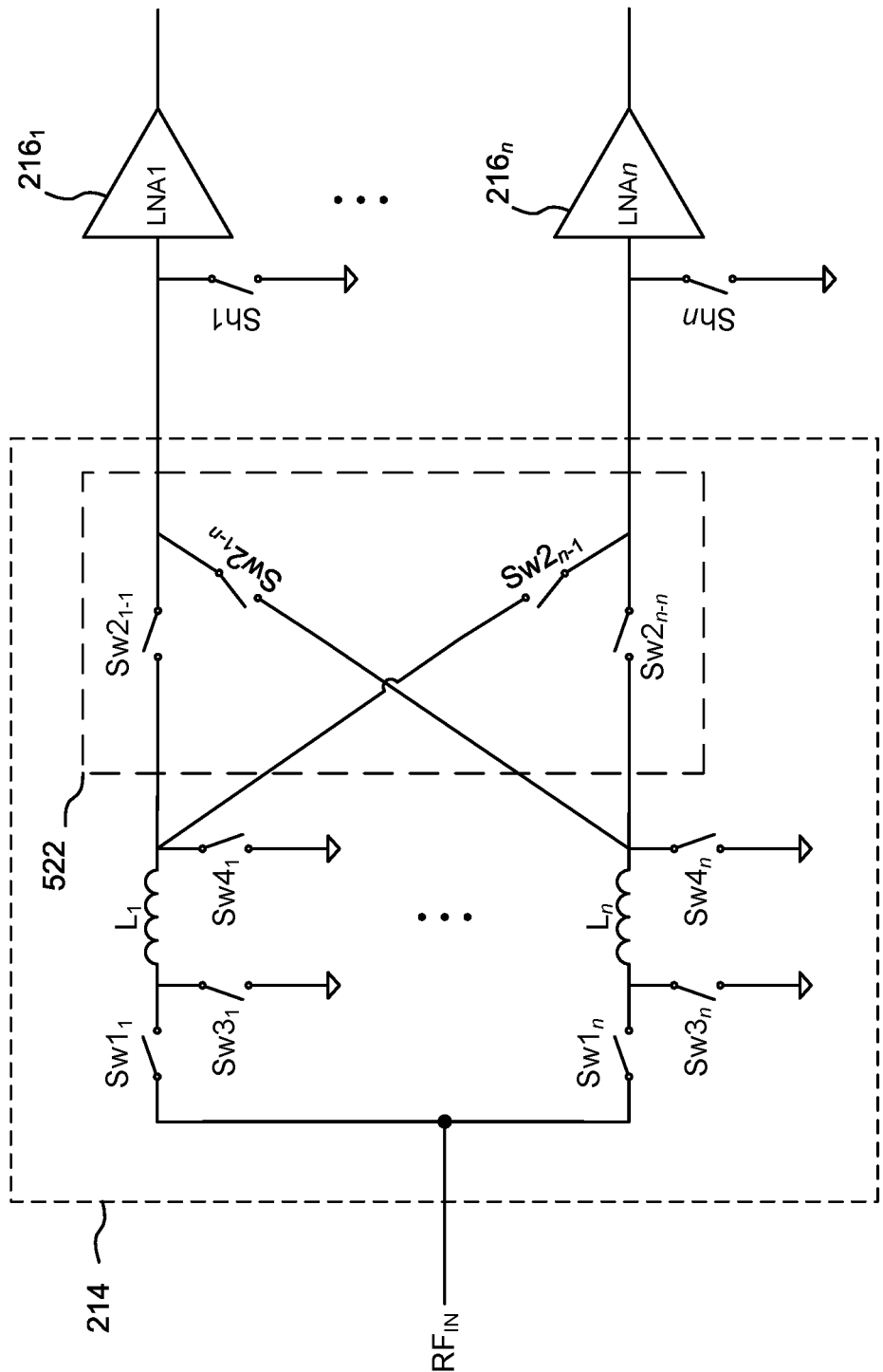
FIG. 5B is a block diagram showing a second configuration of multiple LNAs coupled to a switched inductor tuning block through a switching matrix.

FIG. 5B is a block diagram 520 showing a second configuration of multiple LNAs $216_1$-$216_n$ coupled to a switched inductor tuning block 214 through a switching matrix 522. In the illustrated example, the input of any LNA $216_1$-$216_n$ may be coupled to any inductor $L_1$-Ln through a corresponding switch $Sw2_{1-1}$-$Sw2_{1-n}$, $Sw2_{n-1}$-$Sw2_{n-n}$. Shunt switches Sh1-Shn coupled to the respective inputs of the LNAs $216_1$-$216_n$, when closed, provide isolation of non-selected LNAs. An advantage of the matrix-switch configuration of FIG. 5B is that a signal propagated through a selected inductor Lx passes through only one switch before being applied to the input of a selected LNAx.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 6:
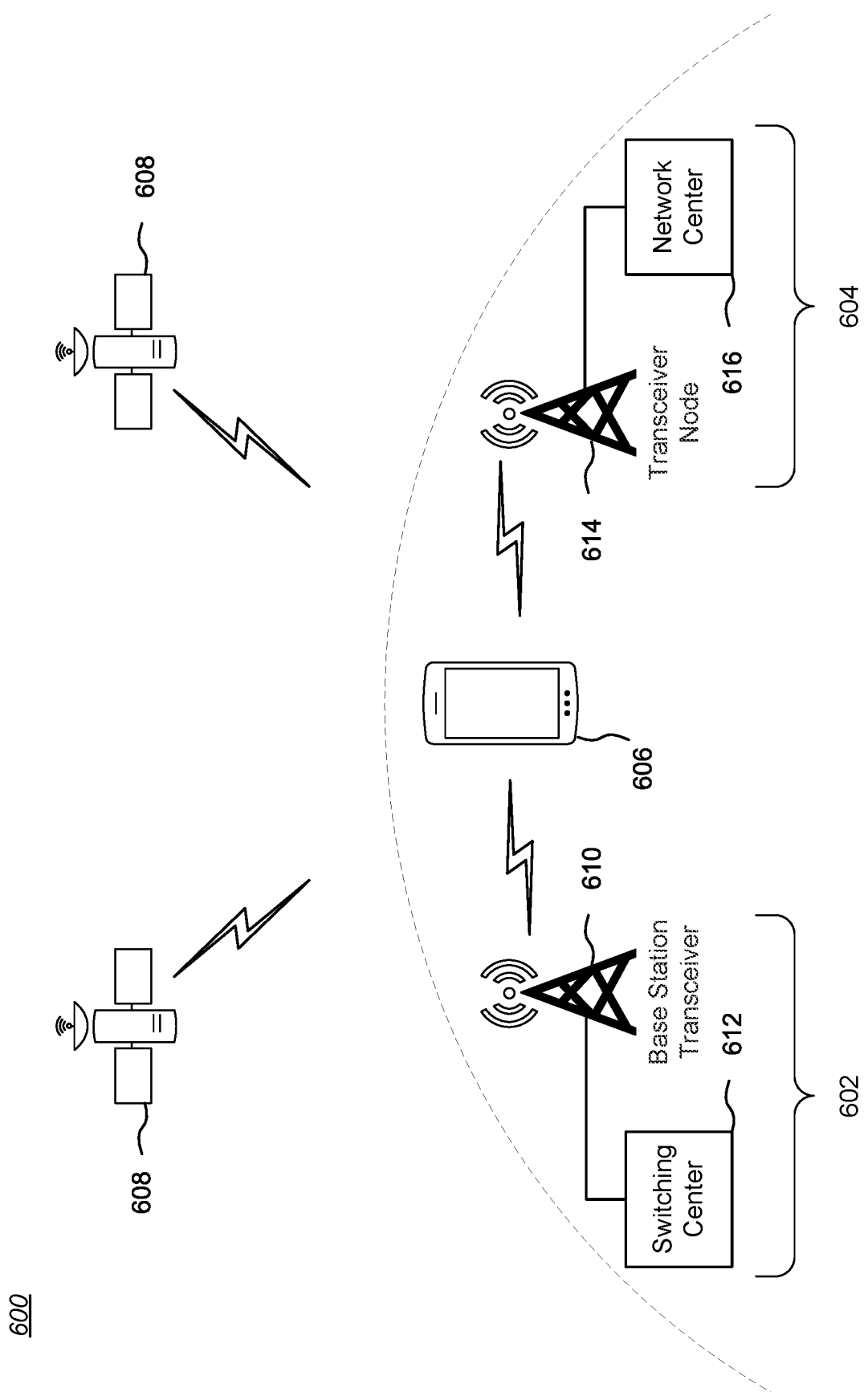
FIG. 6 illustrates an exemplary prior art wireless communication environment including different wireless communication systems, and may include one or more mobile wireless devices.

As an example of wireless RF system usage, FIG. 6 illustrates an exemplary prior art wireless communication environment 600 including different wireless communication systems 602 and 604, and may include one or more mobile wireless devices 606.

A wireless device 606 may be capable of communicating with multiple wireless communication systems 602, 604 using one or more of the telecommunication protocols noted above. A wireless device 606 also may be capable of communicating with one or more satellites 608, such as navigation satellites (e.g., GPS) and/or telecommunication satellites. The wireless device 606 may be equipped with multiple antennas, externally and/or internally, for operation on different frequencies and/or to provide diversity against deleterious path effects such as fading and multipath interference. A wireless device 606 may be a cellular phone, a personal digital assistant (PDA), a wireless-enabled computer or tablet, or some other wireless communication unit or device. A wireless device 606 may also be referred to as a mobile station, user equipment, an access terminal, or some other terminology.

The wireless system 602 may be, for example, a CDMA-based system that includes one or more base station transceivers (BSTs) 610 and at least one switching center (SC) 612. Each BST 610 provides over-the-air RF communication for wireless devices 606 within its coverage area. The SC 612 couples to one or more BSTs in the wireless system 602 and provides coordination and control for those BSTs.

The wireless system 604 may be, for example, a TDMA-based system that includes one or more transceiver nodes 614 and a network center (NC) 616. Each transceiver node 614 provides over-the-air RF communication for wireless devices 606 within its coverage area. The NC 616 couples to one or more transceiver nodes 614 in the wireless system 604 and provides coordination and control for those transceiver nodes 614.

In general, each BST 610 and transceiver node 614 is a fixed station that provides communication coverage for wireless devices 606, and may also be referred to as base stations or some other terminology. The SC 612 and the NC 616 are network entities that provide coordination and control for the base stations and may also be referred to by other terminologies.

Figure 7:
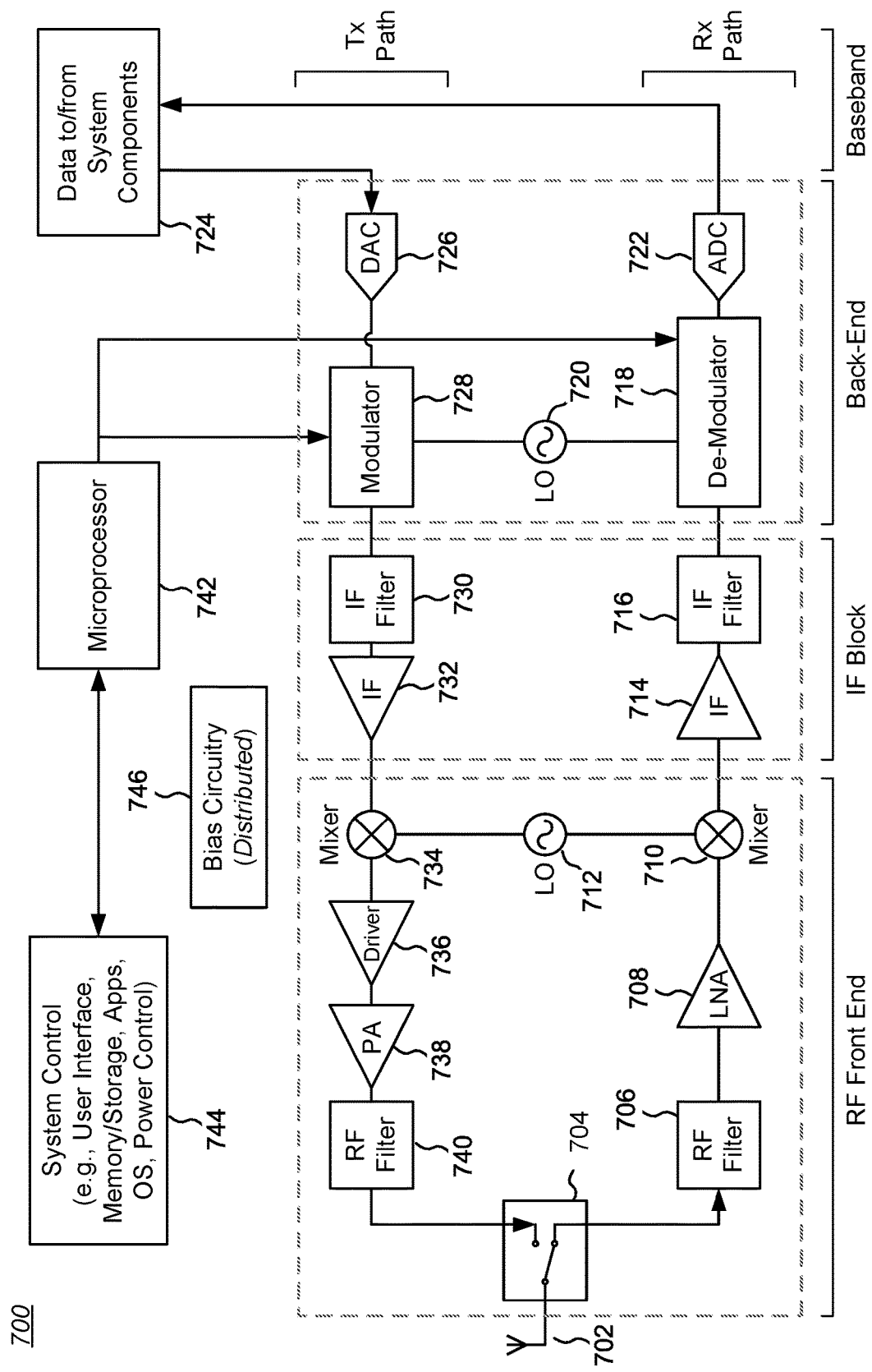
FIG. 7 is a block diagram of a transceiver that might be used in a wireless device, such as a cellular telephone, and which may beneficially incorporate an embodiment of the present invention for improved performance at a small IC chip size.

An important aspect of any wireless system, including the systems shown in FIG. 7, is in the details of how the component elements of the system perform. FIG. 7 is a block diagram of a transceiver 700 that might be used in a wireless device, such as a cellular telephone, and which may beneficially incorporate an embodiment of the present invention for improved performance at a small IC chip size. As illustrated, the transceiver 700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 702 and a switching unit 704, which may be implemented with active switching devices (e.g., field effect transistors or FETs), or with passive devices that implement frequency-domain multiplexing, such as a diplexer or duplexer. An RF filter 706 passes desired received RF signals to a low noise amplifier (LNA) circuit 708, the output of which is combined in a mixer 710 with the output of a first local oscillator 712 to produce an intermediate frequency (IF) signal. The LNA circuit 708 may be, for example, an embodiment of the LNA circuit 200 of FIG. 2 using a MOSFET implementation of the switched inductor tuning block 214 in accordance with FIG. 4.

The IF signal may be amplified by an IF amplifier 714 and subjected to an IF filter 716 before being applied to a demodulator 718, which may be coupled to a second local oscillator 720. The demodulated output of the demodulator 718 is transformed to a digital signal by an analog-to-digital converter 722 and provided to one or more system components 724 (e.g., baseband signal processing, a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 724 is transformed to an analog signal by a digital-to-analog converter 726, the output of which is applied to a modulator 728, which also may be coupled to the second local oscillator 720. The modulated output of the modulator 728 may be subjected to an IF filter 730 before being amplified by an IF amplifier 732. The output of the IF amplifier 732 is then combined in a mixer 734 with the output of the first local oscillator 712 to produce an RF signal. The RF signal may be amplified by a driver 736, the output of which is applied to a power amplifier (PA) 738. The amplified RF signal may be coupled to an RF filter 740, the output of which is coupled to the antenna 702 through the switching unit 704.

The operation of the transceiver 700 is controlled by a microprocessor 742 in known fashion, which interacts with system control components (e.g., user interfaces, memory/storage devices, application programs, operating system software, power control, etc.). In addition, the transceiver 700 will generally include other circuitry, such as bias circuitry 746 (which may be distributed throughout the transceiver 700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 700 may be in a positioned in a different order (e.g., filters) or omitted. Other components can be (and usually are) added (e.g., additional filters, impedance matching networks, variable phase shifters/attenuators, power dividers, etc.).

As discussed above, amplifiers in accordance with the present invention provide wideband coverage, high gain, a low noise factor (NF), small size, and low cost. As a person of ordinary skill in the art will understand, the system architecture of a transceiver utilizing embodiments of the present invention and of products incorporating such transceivers is beneficially impacted by the current invention in critical ways, including high performance, small overall IC chip size, and lower cost. These system-level improvements are specifically enabled by the current invention and may be critical to the overall solution shown in FIG. 7 for many applications. The current invention therefore specifically defines a system-level embodiment that is creatively enabled by its inclusion in that system.

Methods

Figure 8:
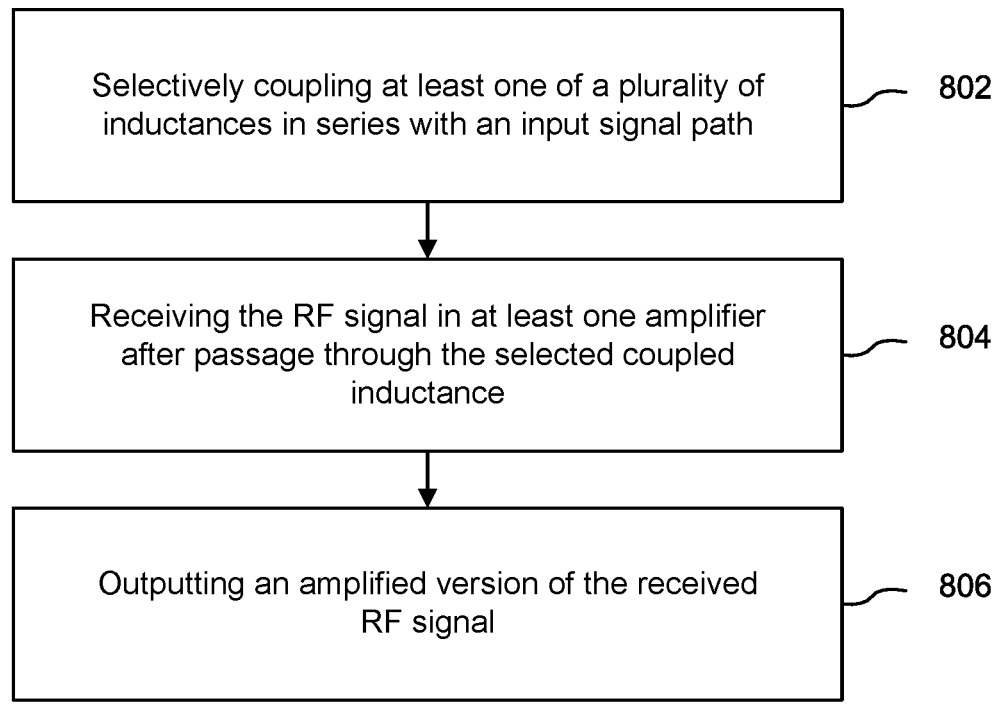
FIG. 8 is a process flow chart showing one method of providing a wideband radio frequency (RF) signal to at least one amplifier.

Another aspect of the invention includes methods of providing a wideband radio frequency (RF) signal to at least one amplifier. For example, FIG. 8 is a process flow chart 800 showing one method of providing a wideband radio frequency (RF) signal to at least one amplifier. The method includes: selectively coupling at least one of a plurality of inductances in series with an input signal path (Block 802); receiving the RF signal in at least one selected amplifier after passage through the selected coupled inductance (Block 804); and outputting an amplified version of the received RF signal (Block 806).

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier circuit including:
(a) an input signal path for receiving a wideband radio frequency (RF) signal;
(b) a switched inductor tuning block coupled to the input signal path and configured to selectively couple at least one of a plurality of inductances in series with the input signal path, wherein the switched inductor tuning block includes a plurality of selectable branches, each branch including:
(1) an RF signal input switch;
(2) an RF signal output switch;
(3) an inductor coupled between the RF signal input switch and the RF signal output switch;
(4) a first shunt switch coupled between a first terminal of the inductor and circuit ground; and
(5) a second shunt switch coupled between a second terminal of the inductor and circuit ground; and
(c) at least one amplifier, each amplifier having an input coupled to the switched inductor tuning block and configured to receive the RF signal after passage through the coupled at least one of the plurality of inductances, and an output for providing an amplified version of the RF signal.

2. The invention of claim 1, wherein each of the switches comprises at least one field effect transistor.

3. The invention of claim 2, wherein the total width of the at least one field effect transistor comprising the RF signal output switch is less than the total width of the at least one field effect transistor comprising the RF signal input switch.

4. The invention of claim 2, wherein each of the switches comprises a MOSFET fabricated by a silicon-on-insulator process.

5. The invention of claim 1, wherein each of the switches comprises at least one field effect transistor embodied in an integrated circuit configured to be coupled to the inductor as an external component.

6. The invention of claim 1, wherein each of the RF signal input switch and the RF signal output switch comprise a field effect transistor, and each of the first shunt switch and the second shunt switch comprise at least two series-coupled field effect transistors.

7. The invention of claim 1, wherein in a signal passage mode for a branch when selected, the RF signal input switch and the RF signal output switch are CLOSED and the first and second shunt switch are OPEN, and in an isolation mode for the branch when not selected, the RF signal input switch and the RF signal output switch are OPEN and the first and second shunt switch are CLOSED.

8. The invention of claim 1, wherein more than one of the plurality of selectable branches may be selected at one time.

9. A low-noise amplifier circuit including:
(a) an input signal path for receiving a wideband radio frequency (RF) signal;
(b) a switched inductor tuning block coupled to the input signal path and configured to selectively couple at least one of a plurality of inductances in series with the input signal path, the switched inductor tuning block including a plurality of selectable branches, each branch including:
(1) an RF signal input switch;
(2) an RF signal output switch;
(3) an inductor coupled between the RF signal input switch and the RF signal output switch;
(4) a first shunt switch coupled between a first terminal of the inductor and circuit ground;
(5) a second shunt switch coupled between a second terminal of the inductor and circuit ground; and
(c) at least one low-noise amplifier, each low-noise amplifier having an input coupled to the switched inductor tuning block and configured to receive the RF signal after passage through a selected one of the plurality of inductances, and an output for providing an amplified version of the RF signal.

10. The invention of claim 9, wherein each of the switches comprises at least one field effect transistor.

11. The invention of claim 10, wherein the total width of the at least one field effect transistor comprising the RF signal output switch is less than the total width of the at least one field effect transistor comprising the RF signal input switch.

12. The invention of claim 10, wherein each of the switches comprises a MOSFET fabricated by a silicon-on-insulator process.

13. The invention of claim 9, wherein each of the switches comprises at least one field effect transistor embodied in an integrated circuit configured to be coupled to the inductor as an external component.

14. The invention of claim 9, wherein each of the RF signal input switch and the RF signal output switch comprise a field effect transistor, and each of the first shunt switch and the second shunt switch comprise at least two series-coupled field effect transistors.

15. The invention of claim 9, wherein in a signal passage mode for a branch when selected, the RF signal input switch and the RF signal output switch are CLOSED and the first and second shunt switch are OPEN, and in an isolation mode for the branch when not selected, the RF signal input switch and the RF signal output switch are OPEN and the first and second shunt switch are CLOSED.

16. The invention of claim 9, wherein more than one of the plurality of selectable branches may be selected at one time.

17. A low-noise amplifier circuit including:
(a) an input signal path for receiving a wideband radio frequency (RF) signal;
(b) a switched inductor tuning block coupled to the input signal path and configured to selectively couple at least one of a plurality of inductances in series with the input signal path, the switched inductor tuning block including a plurality of selectable branches, each branch including:
  (1) an RF signal input comprising at least one series-coupled field effect transistor (FET) switch;
  (2) an RF signal output switch comprising at least one series-coupled FET;
  (3) an inductor coupled between the RF signal input switch and the RF signal output switch;
  (4) a first shunt switch coupled between a first terminal of the inductor and circuit ground and comprising at least one series-coupled FET;
  (5) a second shunt switch coupled between a second terminal of the inductor and circuit ground and comprising at least one series-coupled FET; and
(c) at least one low-noise amplifier, each low-noise amplifier having an input coupled to the switched inductor tuning block and configured to receive the RF signal after passage through a selected one of the plurality of inductances, and an output for providing an amplified version of the RF signal.

18. The invention of claim 17, wherein the FETs are embodied in an integrated circuit configured to be coupled to the inductor as an external component.

19. The invention of claim 17, wherein each of the RF signal input switch and the RF signal output switch comprise one field effect transistor, and each of the first shunt switch and the second shunt switch comprise at least two series-coupled field effect transistors.

20. The invention of claim 17, wherein in a signal passage mode for a branch when selected, the RF signal input switch and the RF signal output switch are CLOSED and the first and second shunt switch are OPEN, and in an isolation mode for the branch when not selected, the RF signal input switch and the RF signal output switch are OPEN and the first and second shunt switch are CLOSED.

21. The invention of claim 17, wherein more than one of the plurality of selectable branches may be selected at one time.

22. An amplifier circuit including:
(a) an input signal path for receiving a wideband radio frequency (RF) signal;
(b) a switched inductor tuning block coupled to the input signal path and configured to selectively couple at least one of a plurality of inductances in series with the input signal path, the switched inductor tuning block including a plurality of selectable branches, each branch including:
  (1) an RF signal input switch;
  (2) an RF signal output switch;
  (3) an inductor coupled between the RF signal input switch and the RF signal output switch;
  (4) a first shunt switch coupled between a first terminal of the inductor and circuit ground; and
  (5) a second shunt switch coupled between a second terminal of the inductor and circuit ground; and
(c) at least one amplifier, each amplifier having an input coupled to the switched inductor tuning block through a respective series switch, each amplifier configured to receive the RF signal after passage through a selected one of the plurality of inductances, and an output for providing an amplified version of the RF signal.

23. An amplifier circuit including:
(a) an input signal path for receiving a wideband radio frequency (RF) signal;
(b) a switched inductor tuning block coupled to the input signal path and configured to selectively couple at least one of a plurality of inductances in series with the input signal path, the switched inductor tuning block including a plurality of selectable branches, each branch including:
  (1) an RF signal input switch;
  (2) an inductor coupled to the RF signal input switch;
  (3) a first shunt switch coupled between a first terminal of the inductor and circuit ground; and
  (4) a second shunt switch coupled between a second terminal of the inductor and circuit ground; and
(c) a plurality of amplifiers, each amplifier having an input coupled to the second terminal of each inductor within the plurality of selectable branches of the switched inductor tuning block through a switching matrix, each amplifier configured to receive the RF signal after passage through a selected one of the plurality of inductances, and an output for providing an amplified version of the RF signal.

* * * * *